United States Patent [19]

Gäsler

[11] Patent Number: 4,703,213

[45] Date of Patent: Oct. 27, 1987

[54] DEVICE TO OPERATE A PIEZOELECTRIC ULTRASONIC TRANSDUCER

[76] Inventor: Herbert Gäsler, Rotweg 4, D-7909 Bollingen, Fed. Rep. of Germany

[21] Appl. No.: 885,767

[22] Filed: Jul. 15, 1986

Related U.S. Application Data

[63] Continuation-in-part of Ser. No. 686,398, Dec. 26, 1985, abandoned.

[30] Foreign Application Priority Data

Jan. 19, 1984 [DE] Fed. Rep. of Germany ....... 3401735

[51] Int. Cl.⁴ ............................................ H01L 41/08

[52] U.S. Cl. .................................. 310/316; 318/116; 239/102.2

[58] Field of Search ......................... 310/316, 317, 36; 318/116, 118; 239/102; 333/4,116 R, 116 M

[56] References Cited

U.S. PATENT DOCUMENTS

| | | | |
|---|---|---|---|
| 3,842,340 | 10/1974 | Brandquist | 318/116 X |
| 3,889,166 | 6/1975 | Scurlock | 310/316 X |
| 4,264,837 | 4/1981 | Gaboriaud | 310/316 |
| 4,271,371 | 6/1981 | Furvichi et al. | 310/316 |
| 4,275,363 | 6/1981 | Mishiro et al. | 310/316 X |
| 4,277,758 | 7/1981 | Mishiro | 310/316 X |
| 4,445,063 | 4/1984 | Smith | 310/316 |

*Primary Examiner*—Mark O. Budd
*Attorney, Agent, or Firm*—Edmund M. Jaskiewicz

[57] ABSTRACT

An Ultrasonic Piezoelectric Transducer for atomizing fluids oscillates at its free natural vibration in a parallel resonant circuit. Very short energy pulses are transmitted into the parallel resonant circuit to maintain continuously the free vibration. The measuring the time dependant voltage of the transducer, the transducer vibration frequency is tapped off to regulate the supplied pulses and to transmit them in proper phases. Thus, optimal atomizing is guaranteed in spite of changing operating conditions.

6 Claims, 3 Drawing Figures

DEVICE TO OPERATE A PIEZOELECTRIC ULTRASONIC TRANSDUCER

RELATED APPLICATION

This application is a continuation-in-part of Ser. No. 686,398 filed Dec. 26, 1985, now abandoned.

FIELD OF THE INVENTION

The present invention relates to a device to operate a Piezoelectric Ultrasonic Transducer for atomizing fluids, more particularly, to such a device having a driving circuit with a PLL controlled oscillator for the generation and a transformer for the transmission of the driving energy for the transducer, and in which a measured quantity of energy, necessary to control the oscillator, is tapped from a winding of the transformer.

DESCRIPTION OF RELATED ART

These devices utilize the piezo-effect to transform electrical energy into high frequency, mechanical vibrations for finely atomizing fluids. In U.S. Pat. No. 4,275,363 there is disclosed a device of this kind, in which the transducer is continuously supplied with driving energy by an oscillator, which is controlled with the help of a PLL, controlled itself by the phase relations of current and voltage in the transducer circuit. The oscillation in this device, generated by the oscillator, is forced on the ultrasonic transducer. This has the disadvantage, that a reliable function of the atomizer is not guaranteed at the beginning of the vibration under load or when there are changing working conditions, because the impedance of the transducer, and with this the phase relations of current and voltage in the transducer, change considerably in respect to changes of the load, and that is why a re-tuning of the optimal vibration-frequency is not possible.

A real compensation of the transducer-capacity by inductance as disclosed in U.S. Pat. No. 4,275,363 or other prior art is not possible, because the transducer capacity changes with variations in load.

Variations of load may be caused at the beginning of the vibration by change of temperature, variations or fluctuations of voltage, different densities of fluids, replacing the transducer, etc.

For example, the transducer may be damped considerably before the beginning of the vibration by a remaining drop of fluid, or by the flowing through of not atomized fluid. This causes very different electromechanical characteristics opposed to those desired in the atomizing phase. Since there is no possibility of an automatic tune of the oscillator in the above-mentioned US-PS and other prior art devices, this may reduce the reliability and working-quality of the transducer. Therefore such a device is not suitable for many applications.

SUMMARY OF THE INVENTION

It is the object of the invention to avoid these above-mentioned disadvantages by providing a device to operate an ultrasonic transducer, the transducer qualities of which can match up with the varying operating conditions in an optimal way, and which is suitable for many different applications.

According to one aspect of the present invention a device to operate a piezoelectric ultrasonic transducer especially for atomizing fluids may comprise a driving circuit having a PLL controlled oscillator for the generation and having a transformer for the transmission of the driving energy for the transducer. Means are provided for tapping from the winding of the transformer a measured quantity necessary to control the oscillator and for supplying said measured quantity to the PLL. There is means for supplying the transducer with driving energy by short pulses and for cutting off the driving circuit the time between these short pulses. A parallel resonant circuit includes the inductance of the secondary winding of the transformer and the operating-impedance of the transducer in which the transducer vibrates at its mechanical resonant frequency in a free oscillation during the time between the short pulses. The varying transducer-voltage is tapped from a winding of the transformer as a measured quantity to supply the transducer circuit with the energy-pulses in proper phase.

The parallel-resonant circuit is an impedance which changes as a consequence of mechanical load-changing of the transducer. The changing impedance causes an automatic power-regulation of the transducer, if the inductance is selected correctly. The measured quantity, which is necessary for the regulation of the short energy pulses, is created by the piezoelectric discs which as a generator convert the mechanical vibrations during absence of pulses. In one version of the invention the energy-pulses are transmitted to the parallel-resonant circuit by a transistor switch located before the transformer. To synchronize the PLL there is a filter between transformer and PLL. An increase of the transducer-power, parallel to the increasing transducer load, is obtained by tuning the secondary-winding of the transformer to the special type of the transducer. Thus, an increase of load is causing an increase of voltage in the transducer circuit by de-tuning the electrical resonant frequency.

The advantage obtained by the present invention is that the transducer may have a free vibration at its mechanical resonant frequency caused by the very short energy pulses, and therefore an optimal atomizing is guaranteed under different operating conditions.

The following advantageous qualities of the device on the grounds of the invention result with a comparatively small amount of material:

The atomizer starts the vibration in each position and under each suitable load by withdrawing enough energy from the parallel-resonant circuit, if the short energy pulses, modified by a sweep generator, effect on it.

The atomizing device absorbs a power which is within a wide range of liquid to be atomized proportional to the atomized fluid volume per time unit. Even if there are variations in the characteristics of the fluids to be atomized as e.g., density or viscosity, the absorbing power of the device is adapting likewise.

The transducer will not warm up in an undesirable way at no-load operation, that means without fluid, because the absorbed power is automatically less at no-load operations.

The pulse energy, transmitted to the parallel-resonant circuit, is largely independent of the operating voltage. This causes a constant atomizing power in spite of a strong varying power supply.

The atomizing device on the ground of the invention is able to operate even at low temperatures down to −45° Celsius.

The atomizing device works at a high efficiency of about 85%.

The electrical lines from the secondary winding of the transducer mainly carry sinusoidal voltages. Therefore an interference reduction is not complicated by harmonics.

Because of the mainly sinusoidal transducer vibration, any higher mechanical vibrations which are present in the system are optimally suppressed. Such mechanical vibrations are not desirable since they do not support atomizing but produce losses.

There are only sinusoidal pressures on the discs of the transducer because the transducer works at a free elastic vibration. Therefore, the life-expectancy of the discs is greater and a change of electro-mechanical qualities is diminished in comparison with an activation by square-wave voltages.

DESCRIPTION OF THE DRAWINGS

Other objects and advantages of the present invention will be apparent upon reference to the accompanying description when taken in conjunction with the following drawings, which are exemplary, wherein.

DESCRIPTION OF THE PREFERRED EMBODIMENT

Figure 2:
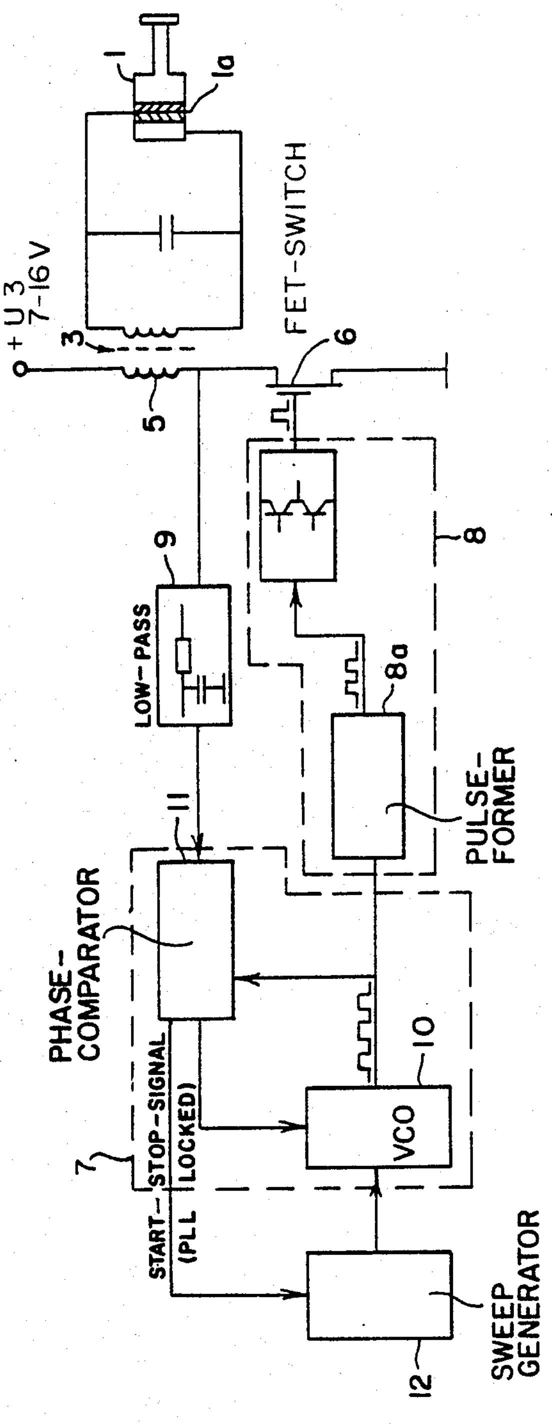
FIG. 2 is a block diagram of the electrical circuit of FIG. 1.

The ultrasonic-transducer-circuit is a parallel resonant circuit (4) containing the operating-impedance of the transducer and the inductance of the secondary winding (2) of the transformer (For some transducers it may be necessary to connect in parallel to the transducer a capacitor.) The transducer is used in a small ultrasonic atomizer system that has been developed for the combustion of liquid fuels in a burner with a thermal output of 20,000 Btu/h. The technique of ultrasonic atomization offers significant advantages over conventional methods since it requires no high-pressure pump and it operates well with a variety of fuels. The system can be throttled or modulated and operates well at any fuel flow rate up to the design maximum.

The ultrasonic atomizer comprises two piezoelectric disks coupled to the fluid load through cylindrical impedance-matching sections. The active portion of the atomizer contains the pair of lead zirconate-titanate disks which are clamped between two aluminum impedance-matching cylinders.

Such an ultrasonic atomizer may have a short cylinder as the inactive or dummy horn, which is ¼ wavelength long at the operating frequency 85 kHz. The longer, necked-down cylinder is the active horn, which is ¾ wavelength long. The geometry of the active horn makes it a mechanical transformer, and, for a given power input, the displacement of the end of the cylinder is greater than if the cylinder were not stepped. In this instance, the increase in the displacement is approximately equal to the ratio of the cross-sectional areas of the large and small portions of the horn. On the transducer there is a small flange at the end of the horn to increase the area of the atomizing surface and so increase the throughput of the unit.

The liquid to be atomized is fed through a small tube to a radial hole near the shoulder of the active horn. This radial hole meets with an axial hole from the atomizing surface at the end of the unit. Thus, the liquid flows onto the surface of the flange at the end of the active horn. Vibration of the thin liquid film breaks up the liquid into aerosol droplets. The diameter of the feed hole is of the order of 0.030 in, which is large enough that it does not readily become plugged from small particles that might be in the liquid to be atomized.

Liquid has been fed to these units from a small pressure system in which the liquid was placed in a container with a tube connected to the atomizer; the container then was pressurized with air, forcing the liquid through the atomizer. The units also have been gravity fed. In either case the flow rate may be controlled: for the pressure system, this may be done by varying the air pressure applied to the liquid; and for gravity-feed system, by varying the hydrostatic pressure or head of the feed system. Control of the liquid feed rate is all that is necessary to control the throughput of the atomizer up to the maximum rate of flow. For these units, the maximum rate of flow of kerosene is 1 lb/h.

Another form of such an ultrasonic transducer is a 40 kHz atomizer, developed by Simms Group Research and Development Ltd, for use in a diesel engine. Vibrations are provided by the synthetic piezoelectric material, which is driven by an oscillator consuming about 25 W. Good coupling is obtained by a clamping arrangement and the backing stub. This is insulated from the high voltage electrode by the glass disc. The stepped horn, with a diameter ratio of approximately six, provides sufficient amplification to effect the atomization of light fuels. The liquid input coupling is made at the nodal step; a point of minimum vibration, where the mounting flanges are also attached. Regardless of the position of the horn, the liquid spreads out by capillary action and is atomized by the longitudinal vibrations to give a spray.

The transformer (3) in this embodiment works as a pulse transformer. The primary winding (5) of the transformer is destined to transmit the energy necessary to continue the vibration, by short pulses. The primary winding (5) is directly connected to a transistor switch (6). The pulses to operate the transistor switch (6) come from a PLL (7) which contains a voltage-controlled oscillator (10) and a phase-comparator (11), the PLL being an integrated circuit to be had everywhere. In this embodiment the PLL is a C-MOS Micro-Power PLL CD 4046 produced by RCA. There is thus a driving circuit having a PLL controlled oscillator for the generation of the driving energy for the transducer. The "driving circuit" is cut off from the transducer circuit between pulses since the transistor switch is open during this time.

In the present invention, the transducer disks use piezoelectric driver disks for the generation of feedback voltage. During the time in which the oscillator does not supply energy to the transducer, the transducer circuit is not connected with the oscillator because of the opened transistor switch. The driver disks generate a voltage proportional to the displacement during the time of absence of energy pulses.

Figure 1:
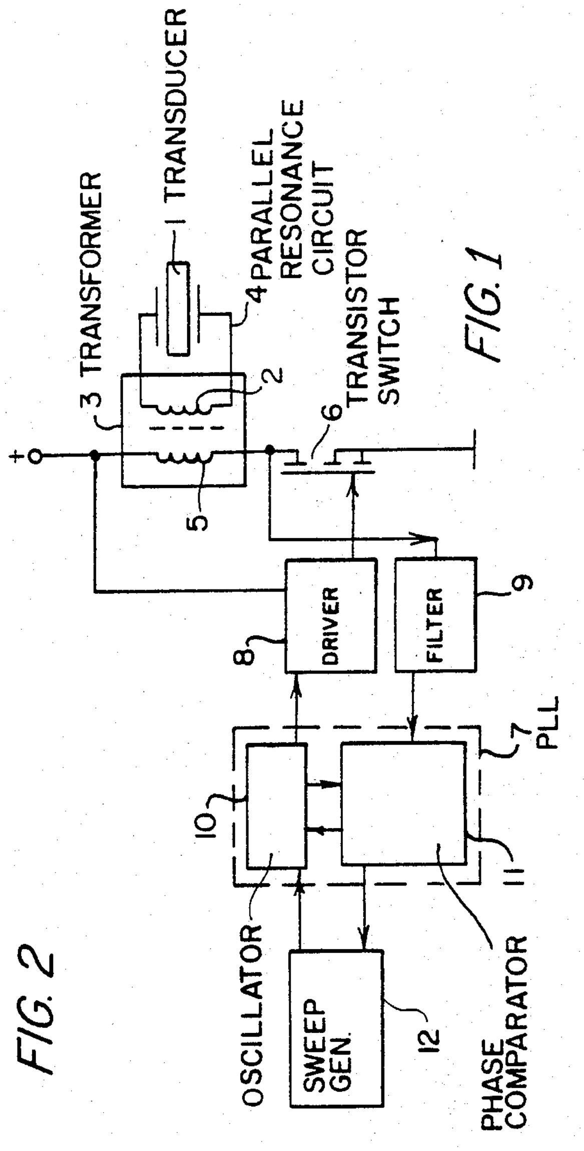
FIG. 1 is a schematic representation of the electrical circuit of the present invention.
Figure 3:
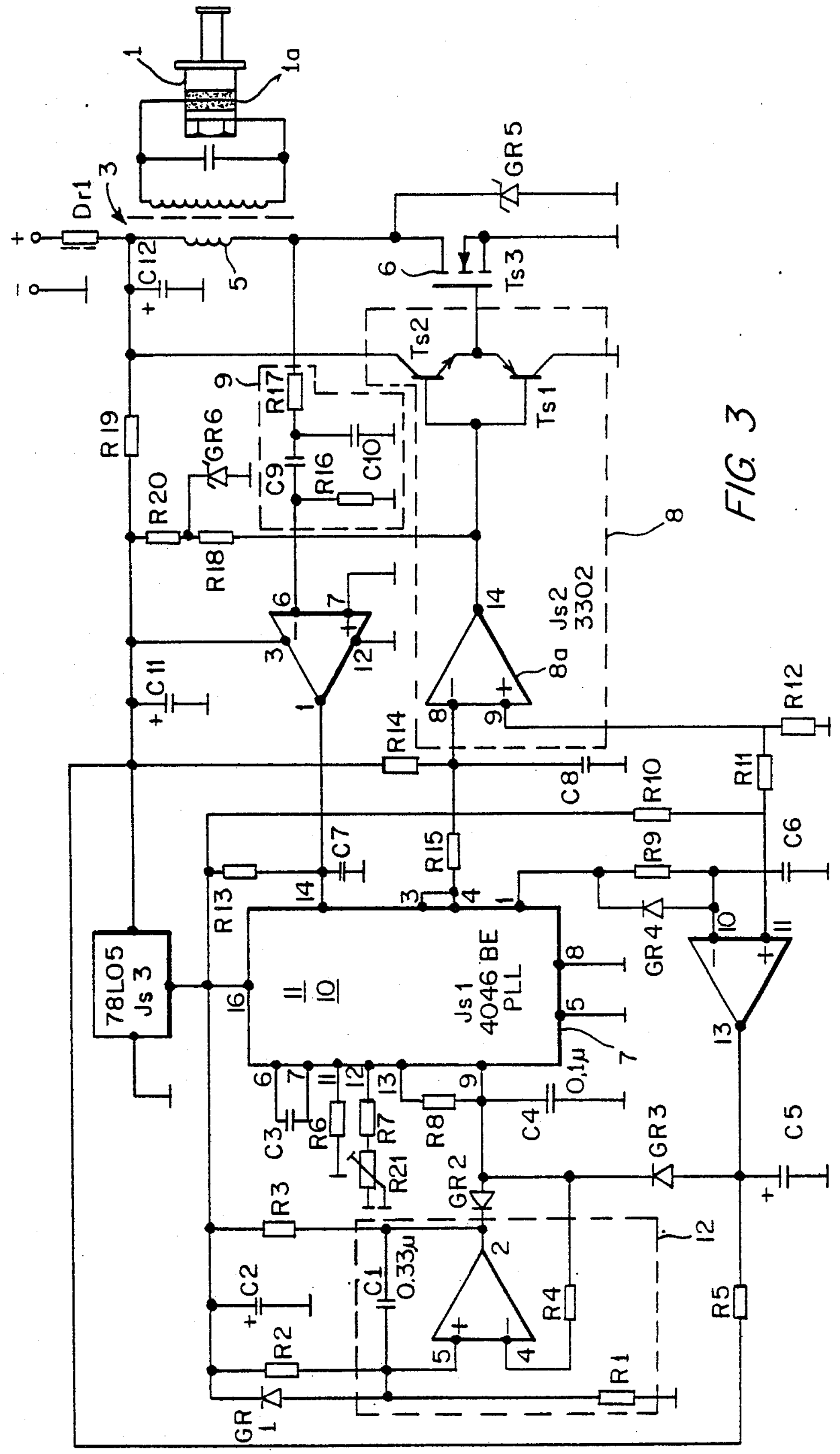
FIG. 3 is an electrical circuit diagram of the present invention as applied to a known ultrasonic atomizer.

There is a driver or driving amplifier (8) between PLL (7) and transistor-switch. The "driver" is an intensifier stage for control of a power our putput amplifier which in the present embodiment is the transistor switch which switches current in the primary winding of the transformer. Such a driving amplifier is disclosed in U.S. Pat. No. 4,277,758 in FIG. 1 at reference 2.

For regulation and for adapting the device to changing operating conditions, the vibration-frequency of the transducer (1) is tapped at a winding of the transformer, and the measured voltage is transmitted to the PLL (7) with the help of a filter (9). The filter causes a phase-shifting and a frequency-clipping of the measured oscillation frequency. After passing the filter the measured quantity synchronizes the PLL. The oscillator (10) of the PLL is connected to a sweep generator (12), which is used to determine the natural frequency of the ultrasonic transducer. If the PLL is not yet synchronized, for example, at switching on, or at a sudden hard change of transducer load, the PLL activates the sweep generator. If, for example, the transducer is strongly damped on the atomizing area by a remaining drop before it starts vibration, the sweep generator is activated in the same way. The oscillator is swept with the help of the sawtooth shaped voltage of the sweep generator. If the frequency of the oscillator corresponds with the natural frequency of the transducer, after a drop has been shaken off or after the vibration with flowing through of fluid has begun, the PLL synchronizes and stops the sweep generator.

The "sweep generator" is needed only to discover the resonant frequency of the transducer, also by oscillations. When the frequency of the oscillator corresponds with the natural frequency of the transducer, the sweep generator will then be disconneted from the PLL.

The energy, necessary to obtain a continuous vibration, is produced by the PLL by means of short-duration energy pulses in proper phase which are transmitted in that circuit with the help of the transistor switch (6) and the transformer (3) in which the transducer oscillates at a free vibration. Now the ultrasonic transducer works in a stable way.

The PLL seeks out and tunes to the mechanical resonance of the transducer and supplies short-duration energy pulses to the transducer circuit. Because of the free mechanical oscillation of the transducer, these pulses must be of a very short duration with respect to the duration of each transducer oscillation. Otherwise, it would not be possible to have a free oscillation of the transducer. For example, consider the pendulum of a clock which would be provided with very short duration pulses so as not to disturb the swinging of the pendulum. As a further example consider that for a transducer having a resonant frequency of 50 kHZ there would be used a short duration pulse of about 3 microseconds, or within a range of 1–4 micro-seconds. For other devices, the short duration pulse is 6–18% of the duration of a transducer oscillation. The pulses are thus of such a short duration as not to interfere with the free oscillation of the transducer.

If there is a change of operating conditions of the transducer caused by changing temperature or load, the measured quantity according to these changed operating conditions is tapped at the primary winding of the transformer and transmitted to the PLL with the help of the filter. With the help of the measured quantity the short energy pulses are prepared proper for regulation and then transmitted to the transducer in the parallel resonant circuit to control transducer-frequency and transducer-power.

If the transducer works in a stable way, the frequency of the PLL has the only purpose to compensate the losses of energy, caused by atomizing, with the help of the very short energy pulses which are transmitted to the transducer oscillating at a free vibration.

As a result of the very short energy pulses, the vibration of the transducer is not affected and the atomizing is produced by sinusoidal electrical and mechanical sizes. The ultrasonic transducer oscillates at a free sinusoidal vibration, mechanically determined by the elastic waves in the transducer and electrically determined by the large-signal impedance of the transducer, the real and imaginary part of which depends on the load of the transducer and added inductance.

The transducer always automatically oscillates at its mechanical resonance frequency because it is subjected only to very short energy pulses. However, it is not necessary to raise the oscillator frequency to the mechanical resonance frequency in a complicated process. The electrical transducer circuit is not tuned to the mechanical resonance.

With reference to FIG. 2, the operation of the present invention will be described.

When power is supplied, the sweep-generator (12) begins to operate and sweeps the VCO (10) frequency within a large range of i.e., 40 to 60 kc (In this range we may expect the mechanical resonant frequency). The VCO emits a square-wave signal with this swept frequency. A pulse-former (8*a*) reduces pulse-length to a length shorter than a quarter of time of a period of mechanical resonant frequency. Transducer (1) vibration-velocity energizes piezoelectric disks (1*a*) during the absence of oscillator (10) pulses. From the primary winding (5) of the transformer (3), this velocity signal can be tapped off and led to the low pass filter (9) and the phase-comparator of the PLL-circuit. The phase comparator (11) tunes the VCO frequency by comparing VCO frequency with velocity-signal to the mechanical resonance frequency of the transducer. If the PLL (7) has locked, the sweep generator (12) is stopped. The circuit for this is contained in the commercially available PLL. The transducer now operates in a stable state at its mechanical resonance. Changes of load, temperature, etc. do not matter, because the transducer always oscillates at its mechanical resonance, that means always at optimum power conditions because PLL (7) regulates frequency of short pulses. The driver (8) is an amplifying stage to operate the FET-Switch (6).

It is to be noted that the transducer (1) is not operated by sine-shaped impulses but by square-waves. Its sine-shaped mechanical vibrations are maintained with the help of the short square-wave impulses.

Thus, it can be seen that the present invention discloses a fundamentally physical solution for frequency follow-up over large temperature ranges and a wide range of manufacturing tolerances of ultrasonic atomizers as well as the solution of oscillation problems of such atomizers under load as occasioned by drops or of liquid adhering to the structure. The invention teaches the solving of these problems in a specific application, mainly an ultrasonic atomizer for liquids such as liquid fuels for burners or heaters and for diesel fuels in diesel engines. It is to be understood that the inventive concept in this application can be applied to various types and structures of ultrasonic atomizers.

It will be understood that this invention is susceptible to modification in order to adapt it to different usages and conditions, and accordingly, it is desired to comprehend such modifications within this invention as may fall within the scope of the appended claims.

What is claimed:

1. A device to operate a Piezoelectric Ultrasonic Transducer especially for atomizing fluids comprising a driving circuit having a PLL controlled oscillator for the generation and having a transformer for the transmission of the driving energy for the transducer; means for tapping from the primary winding of the transformer a measured quantity necessary to control the oscillator and supplying said measured quantity to said PLL; means for supplying the transducer (1) with driving energy in short pulses each having a duration of less than one fourth of an oscillation of the mechanical resonant frequency of said transducer; means for cutting off the driving circuit the time between these short pulses; a parallel resonant circuit (4) comprising the inductance (1) of the secondary winding of the transformer (2) and the operating-impedance of the transducer in which the transducer vibrates at its mechanical resonant frequency in a free oscillation during the time between the short pulses; the varying transducer-voltage being tapped from a winding of the transformer as a measured quantity to supply the transducer circuit with the energy-pulses in proper phase.

2. A device to operate a Piezoelectric Ultrasonic Transducer according to claim 1 wherein the short duration energy-pulses are transmitted to the parallel-resonant circuit (4) by means of a transistor switch connected to the primary winding of the transformer.

3. A device to operate a Piezoelectric Ultrasonic Transducer according to claim 1 wherein a filter (9) is connected between said transformer and said PLL.

4. A device to operate a Piezoelectric Ultrasonic Transducer according to the claims 1 or 2 wherein the secondary winding (2) of the transformer (3) is tuned to said transducer such that the electrical resonant frequency of the parallel resonant circuit (4) is detuned by any increase of load on the transducer whereby there is an increase of voltage in the transducer circuit.

5. A device to operate a Piezoelectric Ultrasonic Transducer according to claim 3 wherein the secondary winding (2) of the transformer (3) is tuned to said transducer such that the electrical resonant frequency of the parallel resonant circuit (4) is detuned by any increase of load on the transducer whereby there is an increase of voltage in the transducer circuit.

6. A device to operate a Piezoelectric Ultrasonic Transducer according to claim 1 and further comprising means for ascertaining the mechanical resonant frequency of the transducer.

* * * * *

UNITED STATES PATENT AND TRADEMARK OFFICE
CERTIFICATE OF CORRECTION

PATENT NO. : 4,703,213

DATED : October 27, 1987

INVENTOR(S) : Herbert Gässler

It is certified that error appears in the above-identified patent and that said Letters Patent is hereby corrected as shown below:

On the Title Page, Item [76], "Herbert Gasler" should read

-- Herbert Gässler --.

Signed and Sealed this

Tenth Day of May, 1988

*Attest:*

DONALD J. QUIGG

*Attesting Officer*

*Commissioner of Patents and Trademarks*